United States Patent
Shaler et al.

(10) Patent No.: US 6,625,440 B1
(45) Date of Patent: Sep. 23, 2003

(54) DRUM MEMORY CONTROLLER

(75) Inventors: Barton G. Shaler, Solana Beach, CA (US); Stephane Mailleau, San Diego, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/494,610

(22) Filed: Jan. 31, 2000

(51) Int. Cl.$^7$ .................................... H04M 11/10
(52) U.S. Cl. ................... 455/412; 455/517; 455/514
(58) Field of Search .................... 455/517, 514, 455/296, 420, 419, 445, 88, 412; 710/21; 711/110, 149, 152, 164, 114, 147, 104, 148, 153, 4, 111, 217; 365/189.01; 340/172.5, 825.22; 364/200; 700/2, 5

(56) References Cited

U.S. PATENT DOCUMENTS

| | | | | |
|---|---|---|---|---|
| 3,568,160 A | * | 3/1971 | Talarezyk | 340/172.5 |
| 3,611,300 A | * | 10/1971 | Aldrich | 340/172.5 |
| 3,729,715 A | * | 4/1973 | Buedel | 340/172.5 |
| 3,845,280 A | * | 10/1974 | Dillon et al. | 235/61.11 R |
| 3,848,262 A | * | 11/1974 | Belcastro | 360/60 |
| 4,213,174 A | * | 7/1980 | Morley et al. | 364/104 |
| 4,484,262 A | * | 11/1984 | Sullivan et al. | 364/200 |
| 4,627,024 A | | 12/1986 | Whalen et al. | |
| 5,530,815 A | | 6/1996 | Nabekura et al. | |
| 5,706,224 A | | 1/1998 | Srinivasan et al. | |

* cited by examiner

*Primary Examiner*—Edward F. Urban
*Assistant Examiner*—C. Chow
(74) *Attorney, Agent, or Firm*—Antonelli, Terry, Stout & Kraus, LLP; Hung H. Bui, Esq.

(57) ABSTRACT

A drum memory controller for controlling random access write and sequential read operations of a drum memory in a communications system. Such drum memory controller (220) may comprise a drum memory (224) having a predetermined number of rows and rings forming a plurality of memory locations arranged in a sequential time order; a random access write address generator (222) which generates write addresses using a respective time tag of incoming data for writing data into memory locations of the drum memory (224) in a random access time order; and a sequential reader (226) which generates read addresses at a constant rate for reading out data stored in the memory locations of the drum memory (224) across each row and then sequencing up in rows in a sequential time order.

17 Claims, 7 Drawing Sheets

Figure 7

DRUM MEMORY CONTROLLER

BACKGROUND OF THE INVENTION

1. Technical Field

The present invention relates to communications systems and, more particularly, to an integrated avionics system with multiple data processing and radio functions sharing a common set of resources through asynchronous time tagged commands sorted in correct time order by a drum memory controller for efficient command execution at corresponding time-of-effectivity (TOE).

2. Related Art

In many communications systems such as modern integrated avionics systems, several signal processors, data processors and controllers are typically used to control a common set of resources such as radio frequency (RF) devices including receivers, transmitters, and antenna electronics and to perform multiple data processing and radio functions. These systems are deployed in a wide variety of avionics applications, including both ground and airborne environments for military and commercial users. Digitally controlled resources such as RF devices may also be used outside of avionics, such as in the telecommunications industry. For example, cellular telephone base stations often include RF devices controlled by digital hardware.

The task of coordinating shared resources (RF devices) in such communications systems is difficult. For example, many resources (RF devices) have no understanding of time, and are configured to execute designated avionics functions immediately upon receipt of corresponding commands. Still different signal/data processors in such communications systems may need to setup different resources at various times prior to execution of those designated avionics functions, including, for example, communications, navigation and identification (CNI) purposes. As a result, communications data such as messages and/or commands may often be asynchronously generated from different signal/data processors at various times for execution. Yet there is no efficient way to coordinate and allocate such communications data in time order and to avoid message processing bottleneck between signal/data processors and shared resources.

One approach to coordinating shared resources is to use an intermediate processor to sort messages into a correct time order, and then store all the asynchronously received communications data from several signal/data processors in first-in, first-out (FIFO) queues. However, implementing storage and retrieval of such communications data under such an approach is both complicated and costly. Each FIFO queue must be loaded in time order and cannot be rearranged. Complex sorting software must be installed at the intermediate processor to sort all the asynchronously received commands in time order while often incurring message processing bottleneck. In addition, complex dedicated logic must be used to arbitrate retrieval of commands.

Therefore, it is desirable to provide a more efficient, yet simplified memory system and control mechanism for sorting all the asynchronously received command messages based on corresponding time tag (time stamp) into a correct time order in a seamless and straight forward manner.

SUMMARY OF THE INVENTION

Accordingly, various embodiments of the present invention are directed to a more efficient and yet simplified drum memory controller for use in a data communications system such as an integrated avionics system to sort command messages from different asynchronous processors into correct time order in a seamless and straight forward manner for timely execution of all command messages while avoiding the traditional software-based processor message sorting overhead and message processing bottleneck, and eliminating interactions between the asynchronous processes and boundary condition difficulties of zero or maximum time values storage.

In accordance with one aspect of the present invention, a drum memory controller is provided to receive data from asynchronous processors and control random access write and sequential read operations of a drum memory. The drum memory controller may comprise a drum memory having a predetermined number of rows and rings forming a plurality of memory locations arranged in a sequential time order; a random access write address generator which generates write addresses using a respective time tag, of incoming data for writing such data into memory locations of the drum memory in a random access time order; and a sequential reader which generates read addresses at a constant rate for reading out data stored in the memory locations of the drum memory across each row and then sequencing up in rows in a sequential time order.

Generally, the random access write address generator may correspond to a dedicated hardware logic implemented to determine the respective time tag of incoming data, and map such time tag into specific addressable memory locations of the drum memory. Similarly, the sequential reader may correspond to a dedicated hardware logic implemented to read through every memory location across a row of the drum memory in a sequential time order. The drum memory may be implemented by a single bank of random-access-memory (RAM) configured in rows and rings for storing all incoming data from different asynchronous processors using a common set of shared resources, for example, radio-frequency (RF) devices, including receivers, transmitters and antenna electronics. Each ring may be designated for different data communications function so as to preserve orthogonality between communications functions, and thereby eliminating contention and collision between the communications functions.

The sequential reader comprises a 13 $\mu s$ counter which indicates when to begin reading from the start of each row of the drum memory in a sequential time order; an address generator which updates successive rows at every 13 $\mu s$ tick from the counter; and a state machine which generates control signals to address physical memory locations of the drum memory for retrieving data from the drum memory.

In accordance with another aspect of the present invention, an overall data communications system is provided including such a drum memory controller control random access write and sequential read operations of data from different asynchronous processors. Such a data communications system may comprise a plurality of asynchronous processors configured to control radio-frequency (RF) devices, including, for example, receivers, transmitters, and antenna; a drum memory controller configured to receive data from the asynchronous processors and control random access write and sequential read operations of a drum memory via a random access write address generator and a sequential reader; and a RF bus controller configured to send data read from said drum memory to the RF devices for execution at respective time-of-effectivity (TOE).

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF EMBODIMENTS OF THE INVENTION

The present invention is applicable for use with all types of communication and data processing systems with multiple data processing functions, time-tagged data and shared resources. Examples of such systems may include integrated avionics systems, cellular telephone systems, Internet-based packet communications systems, modem communications systems, wireless local area networks (LANs), power line communications systems, smart home communications systems, and digital logic test equipment. Communications data may include time division multiple access (TDMA) data. However, for purposes of simplicity, discussions will concentrate mainly on exemplary use of an integrated avionics system with multiple data processing and radio functions sharing common RF resources, although the scope and implementation of the present invention is not limited thereto.

Figure 1:
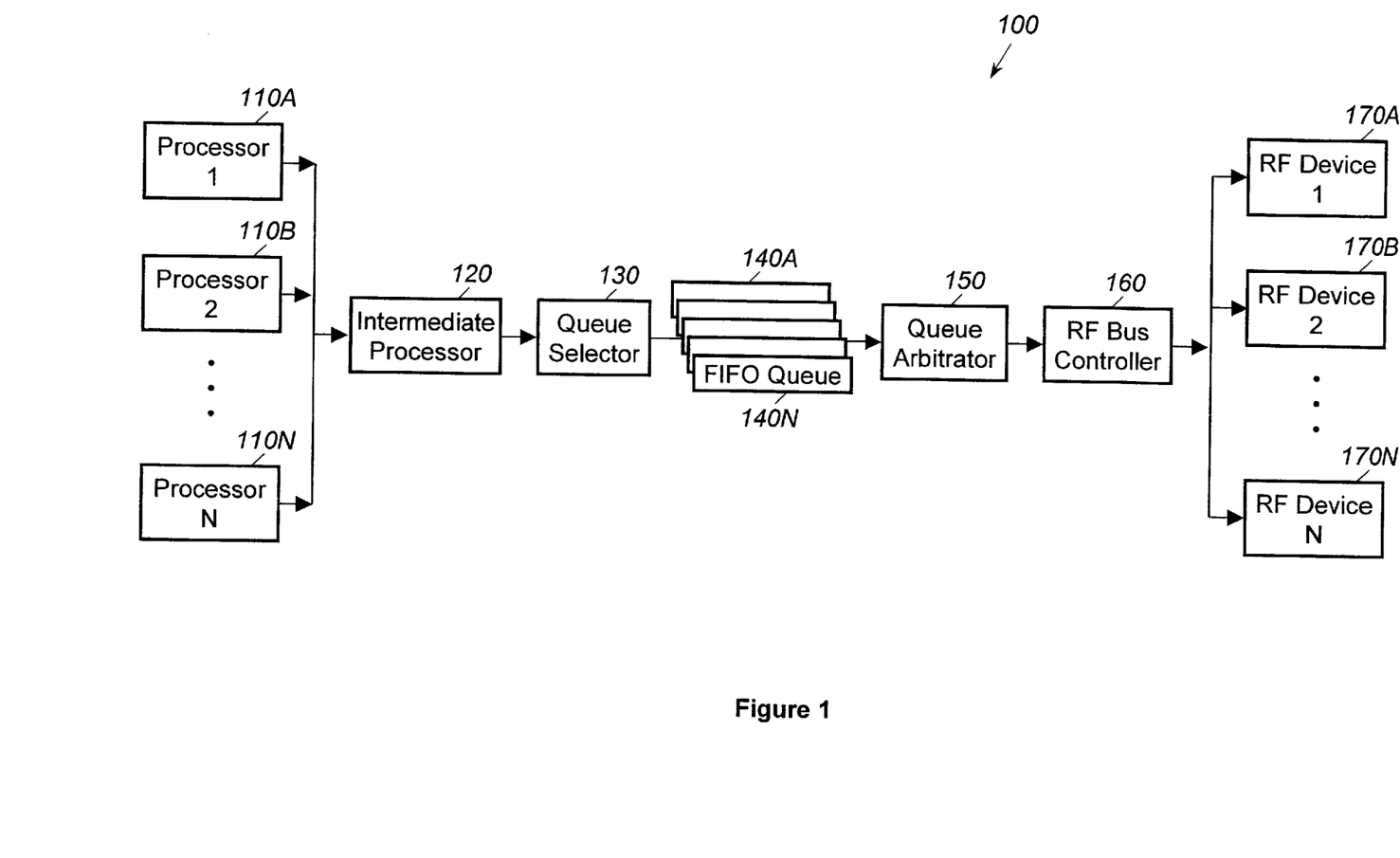
FIG. 1 illustrates an example avionics system using a typical RF control approach to coordinate shared RF resources for multiple data processing and radio functions.

Attention now is directed to the drawings and particularly to FIG. 1, which illustrates an example avionics system using a typical RF control approach to coordinate shared RF resources for multiple data processing and radio functions. As shown in FIG. 1, such a system 100 may include a plurality of processors 110A–110N, an intermediate processor 120, a queue selector 130, a plurality of first-in, first-out (FIFO) queues 140A–140N, a queue arbitrator 150, a RF bus controller 160, and a plurality of RF devices 170A–170N.

Processors 110A–110N may correspond to signal processors and data processors configured to control RF devices 170A–170N. Each processor may be implemented to perform a particular data processing and radio function. RF devices 170A–170 may include, for example, any combination of receivers, transmitters, and antenna electronics used in an integrated avionics system.

Intermediate processor 120 may be provided to sort all the asynchronously received commands from several signal/data processors 110A–110N in time order. The intermediate processor 120 may be a digital signal processor (DSP) chip implemented to run various complex time ordering software to sort all the asynchronously received commands from several signal/data processors 110A–110N in time order.

Queue selector 130 may be provided to read commands from virtual queues of the intermediate processor 120 and write the same into the FIFO queues 140A–140N. The queue selector 130 may be a hardware logic implemented to select an appropriate FIFO queue and load message commands in accordance with designated avionics functions, including, for example, communications, navigation and identification (CNI) purposes.

FIFO queues 140A–140N may be provided to load different message commands in time order. Each FIFO queue may be arranged to handle message commands of a designated avionics function. Thus, different FIFO queues 140A–140N serve to arrange message commands of different avionics functions in time order.

Queue arbitrator 150 may be provided to arbitrate between different FIFO queues 140A–140N and select which message command from any one of those FIFO queues 140A–140N for transmission by the RF bus controller 160 to various RF devices 170A–170N for execution. The queue arbitrator 150 may require a complex hardware logic implemented to arbitrate between multiple commands from several signal/data processors 110A–110N requesting execution of a designated avionics function at the same time.

As described previously, however, implementing storage and retrieval of such message commands using FIFO queues 140A–140N and an intermediate processor 120 can be both complicated and costly. For instance, several complex sorting software must be installed at the intermediate processor 120 to sort all the asynchronously received commands in time order. These software-based processor message sorting methods can be slow and often incur message processing bottleneck at the system front end. Each FIFO queue must be loaded in time order, and command messages stored therein cannot be rearranged or selectively retrieved for priority execution. Therefore, complex algorithm must often be used to flush all command messages stored in the FIFO queues 140A–140N and rewrite selected commands back in the FIFO queues 140A–140N. Even then, there is no way of prioritizing a late command that is critically important to the system, and needs to be the first-out of FIFO queues 140A–140N for immediate execution. Lastly, complex dedicated arbitration logic must be used to arbitrate retrieval of commands from the FIFO queues 140A–140N to avoid multiple commands from different signal/data processors 110A–110N intended for execution of different avionics functions at the same time.

Figure 2:
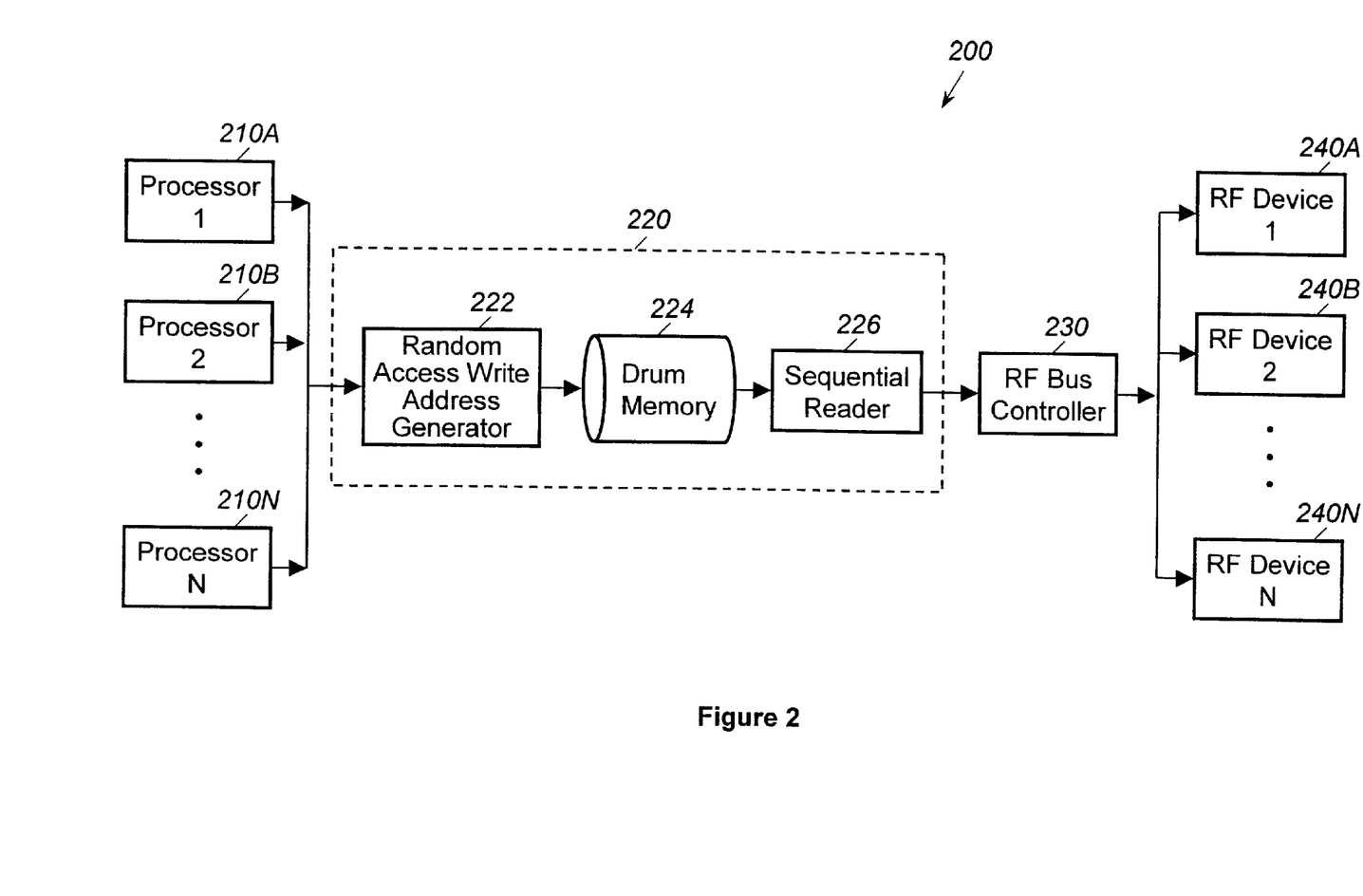
FIG. 2 illustrates an example avionics system using a drum memory RF control approach to coordinate shared RF resources for multiple data processing and radio functions according to an embodiment of the present invention.

Turning now to FIG. 2, an example avionics system using a drum memory RF control approach to coordinate shared RF resources for multiple data processing and radio functions according to an embodiment of the present invention is illustrated. The drum memory RF based controller 220 may be provided to effectively and efficiently order incoming command messages from different asynchronous processors 210A–210N for immediate storage in an especially configured drum memory 224 in correct time order based on the value of their time tag (time stamp) so that these command messages can be sequentially retrieved in a seamless and straight forward manner for timely execution at their time-of-effectivity (TOE). Each incoming command message may contain a command to be executed and a time tag (time stamp) which designates a time at which the command is to be executed, also known as time-of-effectivity (TOE). In particular, the drum memory controller 220 may be implemented to avoid incurring traditional software-based processor message sorting overhead and message processing bottleneck, while simplifying system designs and eliminating interactions between the asynchronous processes and boundary condition difficulties of zero or maximum time values storage associated with FIFO queues.

As shown in FIG. 2, the drum memory controller 220 includes a random access write address generator 222 which generates specific write (row) addresses using respective time tag (time stamp) of each incoming command as an address pointer for random access write operations, an especially configured drum memory 224 with a predetermined number of rows and rings forming memory locations which allows command messages to be written thereon in accordance with write (row) addresses in a random access time order and subsequently read therefrom in accordance with read (drum) addresses in a sequential time order for timely execution at their time-of-effectivity (TOE), and a sequential reader 226 which generates specific read (drum) addresses using a constant time counter for sequential read operations.

The random access write address generator 222 may be a dedicated hardware logic implemented to determine a time tag (time stamp) of an incoming command, and map such time tag (time stamp) to obtain a specific addressable memory location of the drum memory 224. As a result, message processing bottleneck at the system front end may be eliminated if not substantially reduced (from milliseconds to nanoseconds). Likewise, the sequential reader 226 may also a dedicated hardware logic implemented to simply read through every memory location of the drum memory 224 in sequential time order. As a result, no complex arbitration logic may be required. Moreover, complex software may not be required for either the random access write address generator 222 or the sequential reader 226 to perform respective random access write and sequential read functions.

The especially configured drum memory 224 used for storing all the asynchronous command messages from several signal/data processors 210A–210N may be implemented by a single bank of random-access-memory (RAM) that is less expensive and more compact relative to FIFO queues. The static RAM may be used to implement a series of time-orthogonal, time indexed command buffers used to store asynchronous command messages from several signal/data processors 210A–210N based on their time tag (time stamp). Since command messages are stored in the drum memory 224 based on their time tag (time stamp), the smallest time tag value is assigned to memory address zero, the largest time tag value is assigned to the maximum memory address of the drum memory 224. The intermediate addresses may be each appropriately assigned to an incremented time tag. Therefore, when an asynchronous time tagged command is received, the value of the time tag (time stamp) indicates the starting address in the drum memory 224 to store the command, even a multiple word message. When the appropriate time comes to execute the command, again the time tag (time stamp) indicates which a memory block of the drum memory 224 the command should be read from. Because of the way the time tag is assigned to the memory addresses of the drum memory 224, the maximum time may roll over to the minimum time and no storage access problems may occur.

Figure 3:
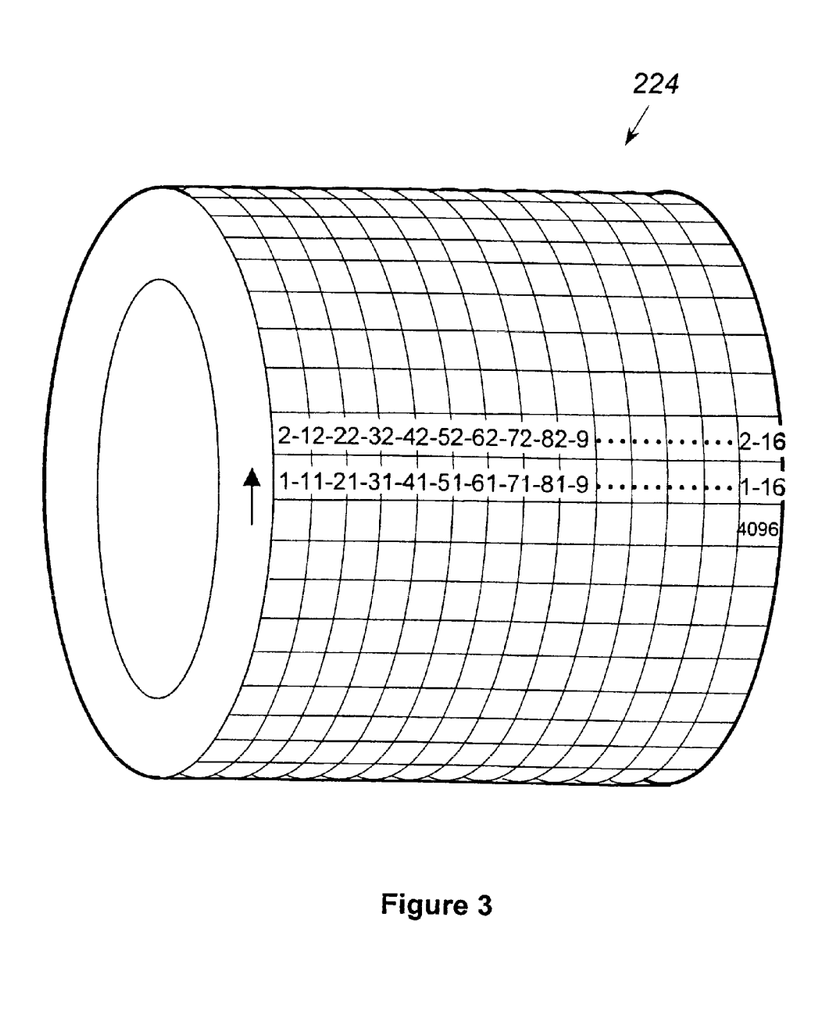
FIG. 3 illustrates an example configuration of a drum memory according to an embodiment of the present invention.
Figures 4A, 4B:
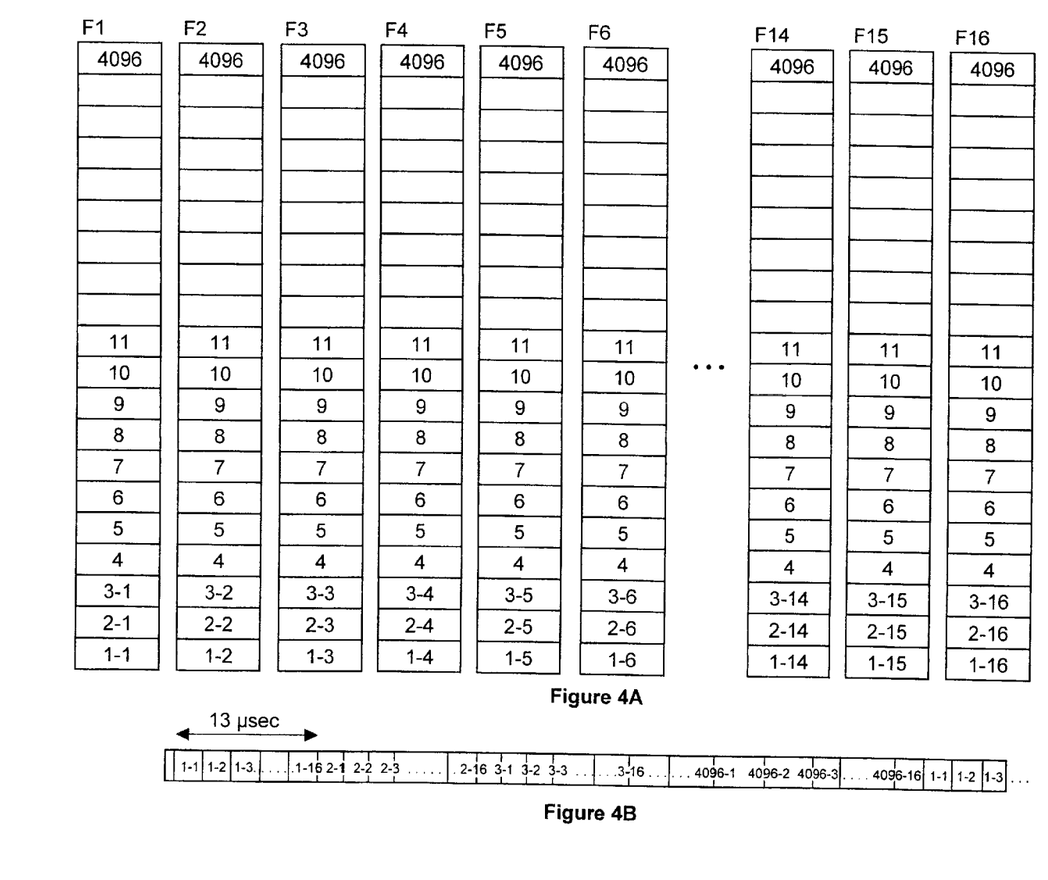
FIGS. 4A–4B illustrate example ring and row configurations of a drum memory according to an embodiment of the present invention.

FIG. 3 illustrates an example configuration of a drum memory 224 according to an embodiment of the present invention. The drum memory 224 may contain, for example, 4096 rows and 16 rings (columns) of memory locations (bins) with each bin having a unique combination of row and ring number. However, the number of rows and rings of the drum memory 224 may be flexible but may be limited by the size of memory chip used. As shown in FIG. 4A, each ring may be designated for a different avionics function F1–F16 so as to allow allocation of commands and preserve total orthogonality between functions, thereby eliminating contention and collision between functions. If a system operating speed at 10 MHz and a 24-bit time counter whose least significant bit is 100 nanoseconds (ns) are used to access the memory locations (bins), the drum memory 224 may be broken down into slots of 13 microseconds ($\mu s$), as the finest RF command resolution needed for example avionics systems. Therefore, when the time-of-effectivity (TOE) of the time tagged message arrives, the 24-bit time tag (time stamp) may be divided by 130 because of the 100 ns time resolution to determine the memory location of the command message. The result then indicates which 13 $\mu s$ memory subslot of the drum memory 224 the command message may be stored in. As a result, asynchronous command messages from several signal/data processors 210A–210N may be written into the drum memory 224 in a random access fashion rather than in time order. However, those command messages as stored in the drum memory 224 may be read out across each row in sequential time order at a constant rate of 13 microseconds ($\mu s$) per row as shown in FIG. 4B. For example, command messages may be read out starting, for example, from row #1, ring#1 (1-1) to row#1, ring#16 (1-16), and then row#2, ring#1 (2-1) to row#2, ring#16 (2-16) . . . row#4096, ring#1 (4096-1) to row#4096, ring#16 (4096-16). If the drum memory 224 contains 4096 13 $\mu s$ slots (rows), each ring may roll over (from 1-1 to 4096-16 and back to 1-1) once every 53.248 milliseconds (4096×13 microseconds). Afterwards each command message read out from the drum memory 224 may be sent to the shared RF devices by the RF bus controller 230 for execution at their time-of-effectivity (TOE).

As shown in FIG. 3, the drum memory 224 can be visualized as a large, slowly turning drum. As a spot on the drum memory 224 passes a fixed location for reading purposes its contents may be dumped out, yet any "bin" of the drum memory 224 can be loaded at any given time. When command messages are dumped out from the drum memory 224, they are done so across a row, one ring at a time. Thus the drum memory 224 may be divided into a two dimensional space, with rings running around the drum indexed in time, and rows running across the drum. The intersection of a ring and a row may represent a single command, executed at a single time.

For use in communications, navigation and identification (CNI) functions, each ring may be assigned to one CNI waveform. Examples of such CNI waveform may include an audio VHS radio waveform and a Global Positioning System waveform used to determine locations. The accuracy requirements of time-of-effectivity (TOE) for CNI commands may be such that any bin of the row will do for any function. This allows allocation of commands to a given ring based only on function number. For example, all commands for function "F1" may be written into the first ring. Likewise, all commands for function "F2" may be written into the second ring, and so on. This ring allocation preserves total orthogonality between functions, thereby eliminating contention and collision between functions. Each ring contains 4096 bins, which read out once per 13 microseconds (μs). Each ring rolls over once every 53.248 milliseconds (ms), meaning commands may be loaded up to 53.248 milliseconds (ms) ahead, without regard to time ordering.

Figure 5:
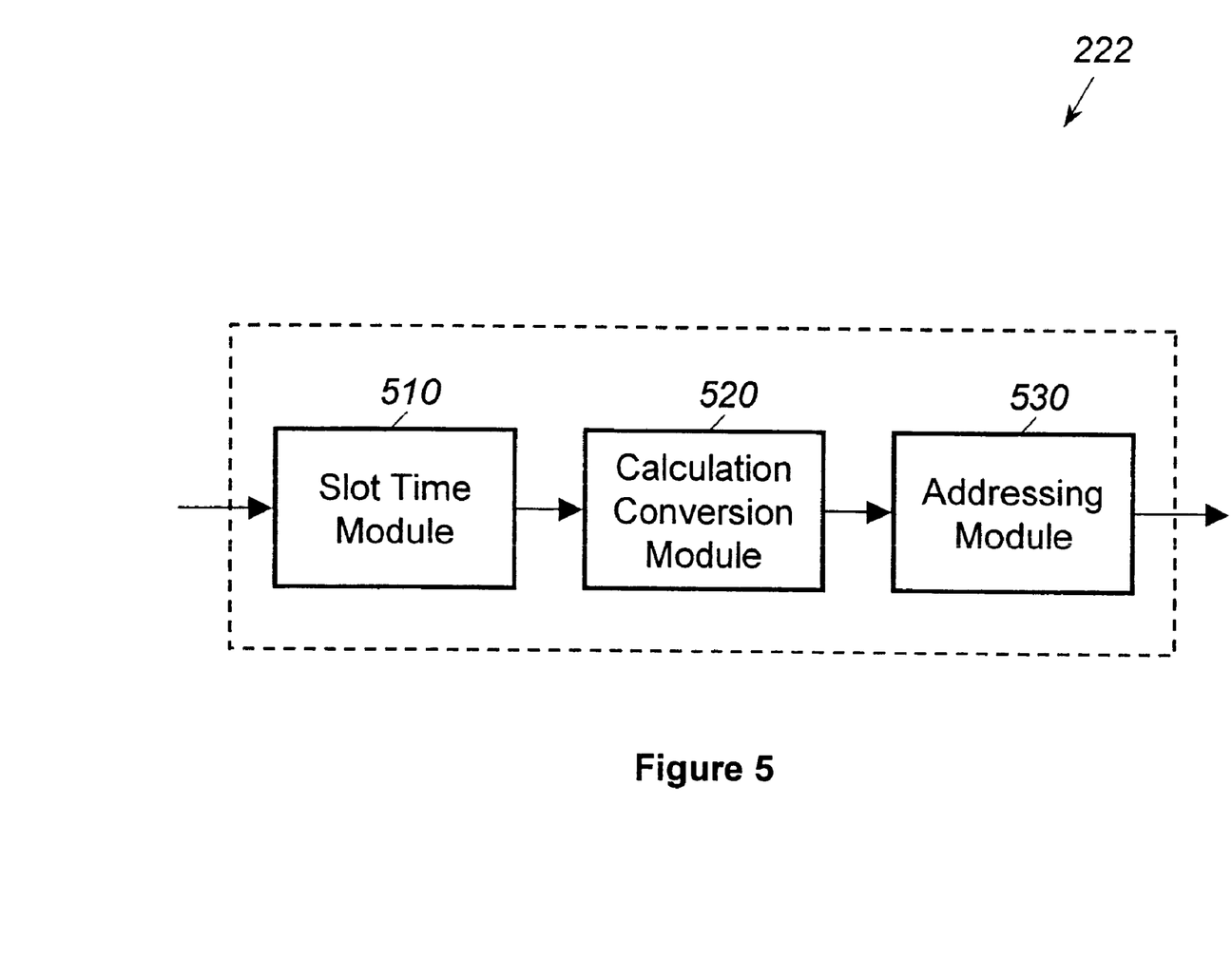
FIG. 5 illustrates an example block diagram of a random access write address generator according to an embodiment of the present invention.

FIG. 5 illustrates an example block diagram of a random access write address :generator 222 according to an embodiment of the present invention. As shown in FIG. 5, the random access write address generator 222 may be a dedicated hardware logic including a slot time module 510, a calculation conversion module 520, and an addressing module 530. Generally, slot time module 510 determines the time tag (time stamp) of an incoming command, and the calculation conversion module 520 generates a preliminary memory location based on the time tag (time stamp) and a conversion factor, where the conversion factor has a preliminary component. The addressing module 530 removes the preliminary component from the preliminary location such that an addressable memory location of the drum memory 224 is obtained.

Figure 6:
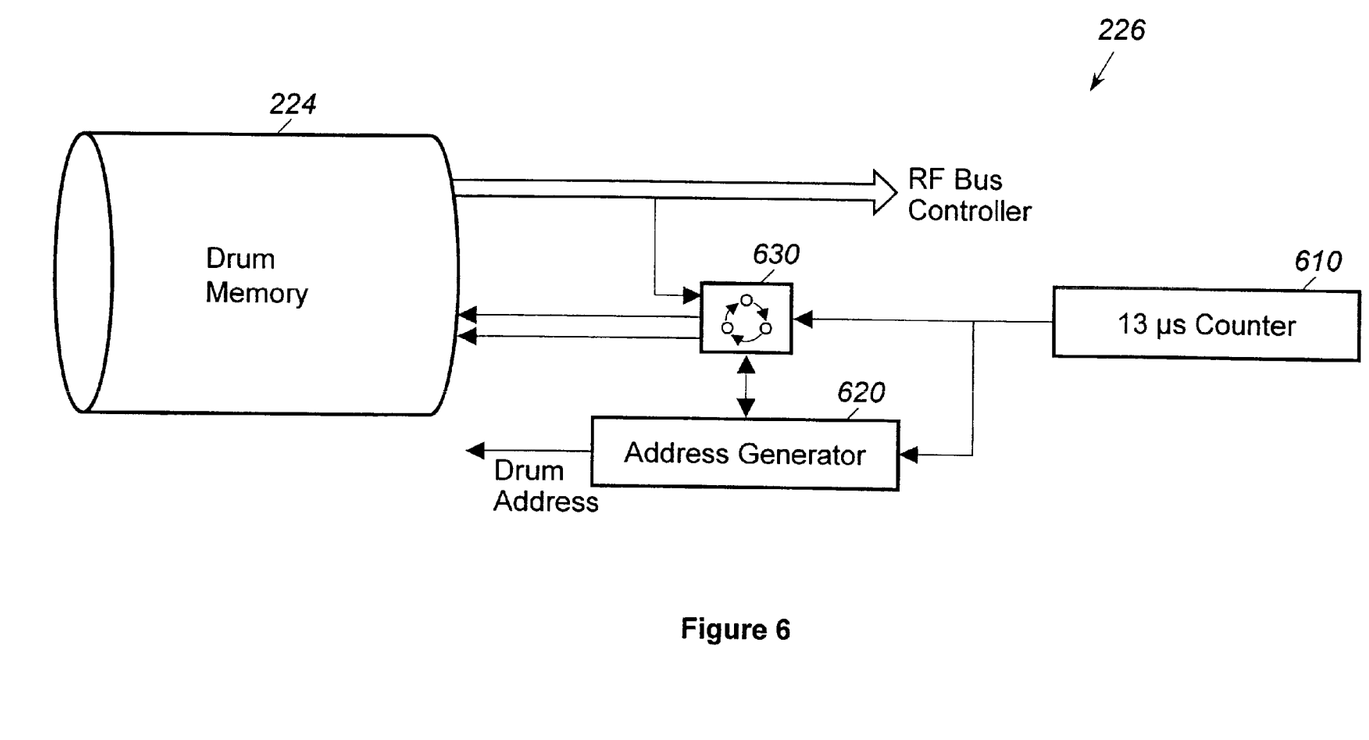
FIG. 6 illustrates an example block diagram of a sequential reader according to an embodiment of the present invention.

FIG. 6 illustrates an example block diagram of a sequential reader 226 according to an embodiment of the present invention. As shown in FIG. 6, the sequential reader 226 may be a dedicated hardware logic including a 13 μs counter 610, an address generator 620, and a state machine 630. 13 μs counter 610 indicates when to begin reading from the start of each row in sequential time order (13 μs/row). In response thereto, the address generator 620 updates the row address at every 13 μs tick from the counter 610 and indicates the state machine 630 to provide the column address and control signals to address the physical memory of the drum memory 224. Overall the address generator 620 generates a read (drum) address for reading out command messages stored on the drum memory 224 for transmission to the RF bus controller 230 for timely execution of designated functions at their respective time-of-effectivity (TOE).

Figure 7:
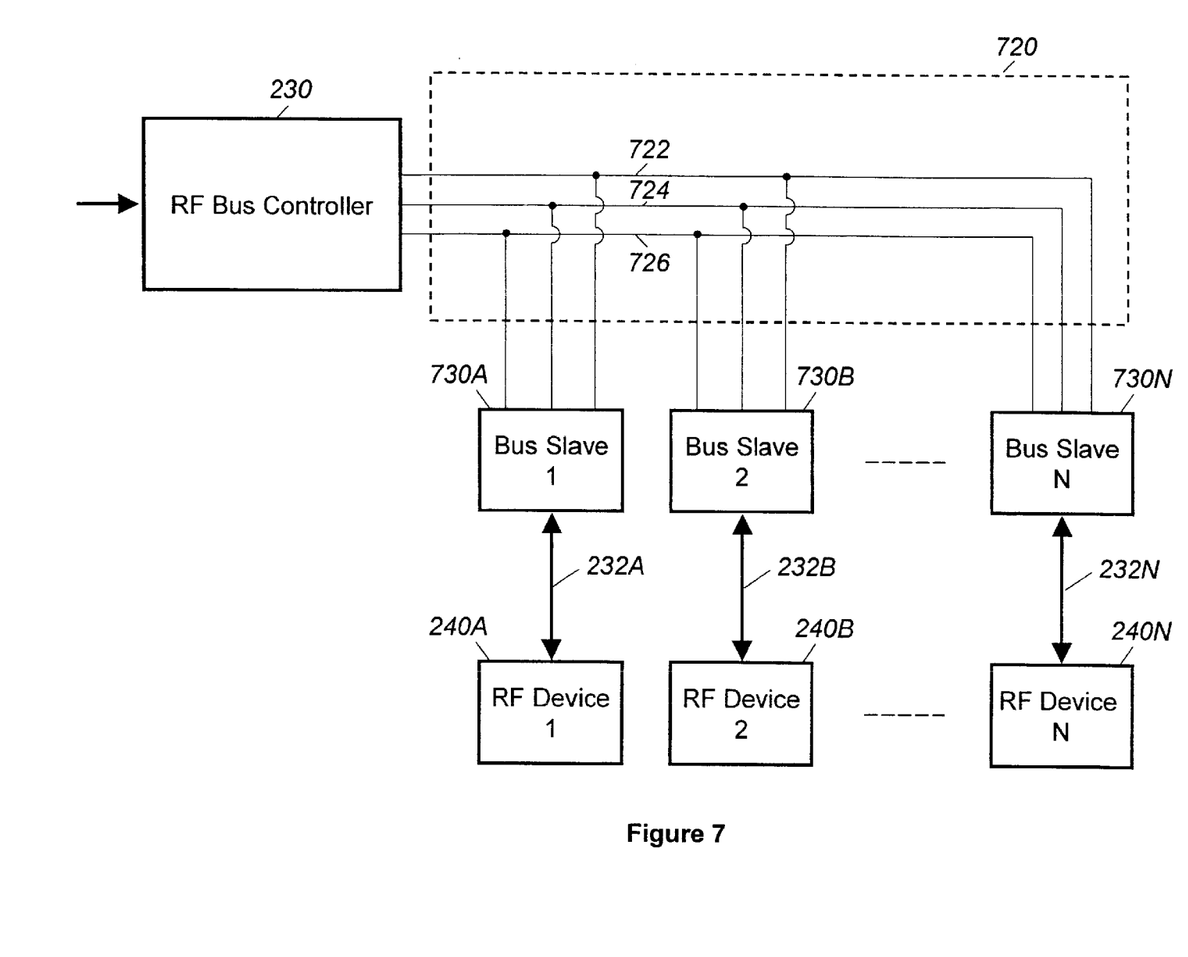
FIG. 7 illustrates an example block diagram of an entire RF bus according to an embodiment of the present invention.

FIG. 7 illustrates an example block diagram of an entire RF bus according to an embodiment of the present invention. As shown in FIG. 7, the RF bus controller 230 may correspond to a RF bus master for providing access to corresponding RF devices 240A–240N via a RF control bus 720, and a plurality of bus slaves 730A–730N. Bus slaves 730A–730N may reside in corresponding RF devices 240A–240N via respective RF interfaces 232A–232N. The RF bus controller (bus master) 230 receives command messages sequentially read from the drum memory 224 (see FIG. 2) by the sequential reader 226 for transmission to various RF devices 240A–240N via respective RF interfaces 232A–232N.

RF bus controller (bus master) 230 and bus slaves 730A–730N may be implemented as hardware, software, or a combination of hardware/software to convert parallel command messages from the sequential reader 226 and RF devices 240A–240N into serial format for transmission across control bus 720. In a preferred embodiment, both the RF bus controller (bus master) 230 and bus slaves 730A–730N are implemented as a dedicated hardware logic for data conversion. The control bus 720 provides a half-duplex serial communication interconnect path between RF bus controller (bus master) 230 and bus slaves 730A–730N. In a preferred embodiment, RF control bus 720 includes three signal paths: an RF data (RFD) line 722, a slave gated clock (SGC) line 724, and a master gated clock (MGC) line 726. All signal paths in the RF control bus 720 may be preferably implemented as low voltage differential signal (LVDS) paths. Each of RFD line 722, SGC line 724 and MGC line 726 may be a differential pair that connects RF bus controller (bus master) 230 to each bus slave 730. All the RFD line 722, SGC line 724 and MGC line 726 may be preferably terminated to reduce reflections due to characteristic impedance mismatch.

RF bus controller (bus master) 230 also provides clock signals to bus slaves 730A–730N via RF control bus 720 when serial data is being transmitted across the bus. Commands may be executed by bus slaves 730A–730N under the control of RF bus controller (bus master) 230. The RF bus controller (bus master) 230 advantageously provides a centralized control of time of execution of all commands so as to free the bus slaves 730A–730N and RF devices 240A–240N from any time keeping requirements.

As described in the foregoing, the present invention provides a more efficient drum memory RF based controller for use in a data communications system such as an integrated avionics system for effectively and efficiently sorting incoming command messages from different asynchronous processors for immediate storage in an especially configured drum memory in correct time order based on their time tag (time stamp) such that these command messages can be sequentially retrieved in a seamless and straight forward manner for timely execution at their time-of-effectivity (TOE). The drum memory controller as implemented according to an embodiment of the present invention advantageously avoids incurring traditional software-based processor message sorting overhead and message processing bottleneck, while simplifying system designs and eliminating interactions between the asynchronous processes and boundary condition difficulties of zero or maximum time values storage associated with FIFO queues. The drum memory controller implementation also simplifies addition of new functions, integration and test of the system, and requires minimum system components.

While there have been illustrated and described what are considered to be preferred embodiments of the present invention, it will be understood by those skilled in the art that various changes and modifications may be made, and equivalents may be substituted for elements thereof without departing from the true scope of the present invention. For example, the drum memory controller implementation may reside in any type of time-tagged data communications systems having multiple data processing functions, and may not be limited to integrated avionics systems shown in FIGS. 1 and 2. Incoming data (command messages) may correspond to all types of communications data including, for example, time division multiple access (TDMA) data. Moreover, both the random access write address generator and the sequential reader may also be implemented by simple software or firmware (hardware/software) to perform respective random access write and sequential read functions. Further, many modifications may be made to adapt a particular situation to the teachings of the present invention without departing from the central scope of the present invention. Therefore, it is intended that the present invention not be limited to the particular embodiment disclosed as the best mode contemplated for carrying out the present invention, but that the present invention includes all embodiments falling within the scope of the appended claims.

What is claimed is:

1. A communications system comprising:
   a plurality of asynchronous processors configured to control radio-frequency (RF) devices, including receivers, transmitters, and antenna;
   a drum memory controller configured to receive data from said asynchronous processors and control random access write and sequential read operations of a drum memory; and a RF bus controller configured to send data read from said drum memory to said RF devices for execution at respective time-of-effectivity (TOE);
said drum memory controller comprising:
  said drum memory having a predetermined number of rows and rings forming a plurality of memory locations arranged in a sequential time order;
  a random access write address generator which generates write addresses using a respective time tag of incoming data from said asynchronous processors for writing said data into memory locations of said drum memory in a random access time order; and
  a sequential reader which generates read addresses at a constant rate for reading out said data stored in said memory locations of said drum memory across each row and then sequencing up in rows in a sequential time order;
wherein said drum memory is implemented by a single bank of random-access-memory (RAM) for storing all incoming data from different asynchronous processors using a common set of shared RF devices;
and wherein said RAM is utilized to implement a series of time-orthogonal, time indexed command buffers for storing all incoming data from different asynchronous processors based on respective time tag.

2. A communications system comprising;
a plurality of asynchronous processors configured to control radio-frequency (RF) devices, including receivers, transmitters, and antenna;
a drum memory controller configured to receive data from said asynchronous processors and control random access write and sequential read operations of a drum memory; and
a RF bus controller configured to send data read from said drum memory to said RF devices for execution at respective time-of-effectivity (TOE);
said drum memory controller comprising:
  said drum memory having a predetermined number of rows and rings forming a plurality of memory locations arranged in a sequential time order;
  a random access write address generator which generates write addresses using a respective time tag of incoming data from said asynchronous processors for writing said data into memory locations of said drum memory in a random access time order;
  a sequential reader which generates read addresses at a constant rate for reading out said data stored in said memory locations of said drum memory across each row and then sequencing up in rows in a sequential time order;
  and wherein each ring of said drum memory is designated for different data communications function so as to preserve orthogonality between communications functions, and thereby eliminating contention and collision between said communications functions.

3. A communications system comprising:
a plurality of asynchronous processors configured to control radio-frequency (RF) devices, including receivers, transmitters, and antenna;
a drum memory controller configured to receive data from said asynchronous processors and control random access write and sequential read operations of a drum memory; and
a RF bus controller configured to send data read from said drum memory to said RF devices for execution at respective time-of-effectivity (TOE);
said drum memory controller comprising;
  said drum memory having a predetermined number of rows and rings forming a plurality of memory locations arranged in a sequential time order;
  a random access write address generator which generates write addresses using a respective time tag of incoming data from said asynchronous processors for writing said data into memory locations of said drum memory in a random access time order; and
  a sequential reader which generates read addresses at a constant rate for reading out said data stored in said memory locations of said drum memory across each row and then sequencing up in rows in a sequential time order;
and wherein said data corresponds to command messages each including a command to be executed and a time tag which designates a time at which the command is to be executed.

4. A communications system comprising:
a plurality of asynchronous processors configured to control radio-frequency (RF) devices, including receivers, transmitters, and antenna;
a drum memory controller configured to receive data from said asynchronous processors and control random access write and sequential read operations of a drum memory; and
a RF bus controller configured to send data read from said drum memory to said RF devices for execution at respective time-of-effectivity (TOE);
said drum memory controller comprising:
  said drum memory having a predetermined number of rows and rings forming a plurality of memory locations arranged in a sequential time order;
  a random access write address generator which generates write addresses using a respective time tag of incoming data from said asynchronous processors for writing said data into memory locations of said drum memory in a random access time order; and
  a sequential reader which generates read addresses at a constant rate for reading out said data stored in said memory locations of said drum memory across each row and then sequencing up in rows in a sequential time order;
and wherein said random access write address generator comprises:
  a slot time module which determines the respective time tag of incoming data;
  a calculation conversion module which generates a preliminary memory location based on the time stamp; and
  an addressing module which generates the write addresses for writing said data into memory locations of said drum memory.

5. A communications system comprising:
a plurality of asynchronous processors configured to control radio-frequency (RF) devices, including receivers, transmitters, and antenna;
a drum memory controller configured to receive data from said asynchronous processors and control random access write and sequential read operations of a drum memory; and
a RF bus controller configured to send data read from said drum memory to said RF devices for execution at respective time-of-effectivity (TOE);
said drum memory controller comprising:

said drum memory having a predetermined number of rows and rings forming a plurality of memory locations arranged in a sequential time order;

a random access write address generator which generates write addresses using a respective time tag of incoming data from said asynchronous processors for writing said data into memory locations of said drum memory in a random access time order; and a sequential reader which generates read addresses at a constant rate for reading out said data stored in said memory locations of said drum memory across each row and then sequencing up in rows in a sequential time order;

and wherein said sequential reader comprises:

a 13 µs counter which indicates when to begin reading from the start of each row of said drum memory in said sequential time order;

an address generator which updates successive rows at every 13 µs tick from the counter; and a state machine which generates control signals to address physical memory locations of said drum memory for data retrieval.

6. A communications system comprising:

a plurality of asynchronous processors configured to control radio-frequency (RF) devices, including receivers, transmitters, and antenna;

a drum memory controller configured to receive data from said asynchronous processors and control random access write and sequential read operations of a drum memory; and a RF bus controller configured to send data read from said drum memory to said RF devices for execution at respective time-of-effectivity (TOE);

said drum memory controller comprising:

said drum memory having a predetermined number of rows and rings forming a plurality of memory locations arranged in a sequential time order;

a random access write address generator which generates write addresses using a respective time tag of incoming data from said asynchronous processors for writing said data into memory locations of said drum memory in a random access time order;

a sequential reader which generates read addresses at a constant rate for reading out said data stored in said memory locations of said drum memory across each row and then sequencing up in rows in a sequential time order;

and wherein said bus controller is arranged to connect to respective RF devices via one or more bus slaves and a control bus, said control bus comprising a bi-directional data line disposed between said bus controller and one or more bus slaves, a first clock line disposed between said bus controller and one or more bus slaves and asserted by said bus controller for data transmission via said bi-directional data line, and a second clock line disposed between said bus controller and one or more bus slaves and asserted by the one or more bus slaves for data transmission via said bi-directional data line.

7. The communications system as claimed in claim 6, wherein said bi-directional data line, said first clock line, and said second clock line represent low voltage differential signal (LVDS) paths between said bus controller and one or more bus slaves.

8. A method for controlling random access write and sequential read operations of data received from a plurality of asynchronous processors configured to control radio-frequency (RF) devices, said method comprising:

receiving incoming data from said asynchronous processors to control said RF devices;

generating write addresses using a respective time tag of said data so as to write said data in a random access time order into memory locations of a drum memory having a predetermined number of rows and rings forming said memory locations arranged in a sequential time order; and generating read addresses at a constant rate so as to read out said data stored in said memory locations of said drum memory across each row and then sequencing up in rows in a sequential time order for transmission to said RF devices for execution at respective time-of-effectivity (TOE);

wherein said drum memory is implemented by a single bank of random-access-memory (RAM) for storing all incoming data from different asynchronous processors using a common set of shared RF devices;

and wherein said RAM is utilized to implement a series of time-orthogonal, time indexed command buffers for storing all incoming data from different asynchronous processors based on respective time tag.

9. A method for controlling random access write and sequential read operations of data received from a plurality of asynchronous processors configured to control radio-frequency (RF) devices, said method comprising:

receiving incoming data from said asynchronous processors to control said RF devices;

generating write addresses using a respective time tag of said data so as to write said data in a random access time order into memory locations of a drum memory having a predetermined number of rows and rings forming said memory locations arranged in a sequential time order; and generating read addresses at a constant rate so as to read out said data stored in said memory locations of said drum memory across each row and then sequencing up in rows in a sequential time order for transmission to said RF devices for execution at respective time-of-effectivity (TOE);

wherein said drum memory is implemented by a single bank of random-access-memory (RAM) for storing all incoming data from different asynchronous processors using a common set of shared RF devices;

and wherein each ring of said drum memory is designated for different RF function so as to preserve orthogonality between communications functions, and thereby eliminating contention and collision between said communications functions.

10. A method for controlling random access write and sequential read operations of data received from a plurality of asynchronous processors configured to control radio-frequency (RF) devices, said method comprising:

receiving incoming data from said asynchronous processors to control said RF devices;

generating write addresses using a respective time tag of said data so as to write said data in a random access time order into memory locations of a drum memory having a predetermined number of rows and rings forming said memory locations arranged in a sequential time order; and generating read addresses at a constant rate so as to read out said data stored in said memory locations of said drum memory across each row and then sequencing up in rows in a sequential time order for transmission to said RF devices for execution at respective time-of-effectivity (TOE);

wherein said drum memory is implemented by a single bank of random-access-memory (RAM) for storing all incoming data from different asynchronous processors using a common set of shared RF devices;

and wherein said data from different asynchronous processors corresponds to command messages each including a command to be executed and a time tag which designates a time at which the command is to be executed.

11. A drum memory controller comprising:

a drum memory having a predetermined number of rows and rings forming a plurality of memory locations arranged in a sequential time order;

a random access write address generator which generates write addresses using a respective time tag of incoming data for writing said data into memory locations of said drum memory in a random access time order; and a sequential reader which generates road addresses at a constant rate for reading out said data stored in said memory locations of said drum memory across each row and then sequencing up in rows in a sequential time order;

wherein said data read out from said drum memory is transmitted to designated shared devices for execution at their time-of-effectivity (TOE);

and wherein said shared resources correspond to radio-frequency (RF) devices, including receivers, transmitters and antenna electronics;

the drum memory controller further including a bus controller arranged to send said data read from said drum memory to said RF devices for execution at respective time-of-effectivity (TOE);

and wherein said bus controller is arranged to connect to respective RF devices via one or more bus slaves and a control bus, said control bus comprising a bi-directional data line disposed between said bus controller and one or more bus slaves, a first clock line disposed between sad bus controller and one or more bus slaves and asserted by said bus controller for data transmission via said bi-directional data line, and a second clock line disposed between said bus controller and one or more bus slaves and asserted by the one or more bus slaves for data transmission via said bi-dimensional data line.

12. The drum memory controller as claimed in claim 11, wherein said bi-directional data line, said first clock line, and said second clock line represent low voltage differential signal (LVDS) paths between said bus controller and one or more bus slaves.

13. A drum memory controller comprising:

a drum memory having a predetermined number of rows and rings forming a plurality of memory locations arranged in a sequential time order;

a random access write address generator which generates write addresses using a respective time tag of incoming data for writing said data into memory locations of said drum memory in a random access time order; and a sequential reader which generates read addresses at a constant rate for reading out said data stored in said memory locations of said drum memory across each row and then sequencing up in rows in a sequential time order;

wherein said data read out from said drum memory is transmitted to designated shared devices for execution at their time-of-effectivity (TOE);

and wherein said data corresponds to command messages each including a command to be executed and a time tag which designates a time at which the command is to be executed.

14. A drum memory controller comprising:

a drum memory having a predetermined number of rows and rings forming a plurality of memory locations arranged in a sequential time order;

a random access write address generator which generates write addresses using a respective time tag of incoming data for writing said data into memory locations of said drum memory in a random access time order; and a sequential reader which generates read addresses at a constant rate for reading out said data stored in said memory locations of said drum memory across each row and then sequencing up in rows in a sequential time order;

wherein said random access write address generator comprises:
  a slot time module which determines the respective time tag of incoming data;
  a calculation conversion module which generates a preliminary memory location based on the time stamp; and
  an addressing module which generates the write addresses for writing said data into memory locations of said drum memory.

15. A drum memory controller comprising:

a drum memory having a predetermined number of rows and rings forming a plurality of memory locations arranged in a sequential time order;

a random access write address generator which generates write addresses using a respective time tag of incoming data for writing said data into memory locations of said drum memory in a random access time order; and a sequential reader which generates read addresses at a constant rate for reading out said data stored in said memory locations of said drum memory across each row and then sequencing up in rows in a sequential time order;

wherein said sequential reader comprises:
  a 13 $\mu$s counter which indicates when to begin reading from the start of each row of said drum memory in said sequential time order;
  an address generator which updates successive rows at every 13 $\mu$s tick from the counter; and
  a state machine which generates control signals to address physical memory locations of said drum memory for data retrieval.

16. A drum memory controller comprising:

a drum memory having a predetermined number of rows and rings forming a plurality of memory locations arranged in a sequential time order;

a random access write address generator which generates write addresses using a respective time tag of incoming data for writing said data into memory locations of said drum memory in a random access time order; and a sequential reader which generates read addresses at a constant rate for reading out said data stored in said memory locations of said drum memory across each row and then sequencing up in rows in a sequential time order;

wherein said drum memory is implemented by a single bank of random-access-memory (RAM) for storing all incoming data from different asynchronous processors using a common set of shared resource;

and wherein said RAM is utilized to implement a series of time-orthogonal, time indexed command buffers for storing all incoming data from different asynchronous processors based on respective time tag.

17. A drum memory controller comprising:

a drum memory having a predetermined number of rows and rings forming a plurality of memory locations arranged in a sequential time order;

a random access write address generator which generates write addresses using a respective time tag of incoming data for writing said data into memory locations of said drum memory in a random access time order; and a sequential reader which generates read addresses at a constant rate for reading out said data stored in said memory locations of said drum memory across each row and then sequencing up in rows in a sequential time order;

wherein each ring of said drum memory is designated for different data communications function so as to preserve orthogonality between communications functions, and thereby eliminating contention and collision between said communications functions.

* * * * *